United States Patent [19]

Uya

[11] 4,417,161

[45] Nov. 22, 1983

[54] COMPLEMENTARY CHANNEL TYPE MOS TRANSISTOR EXCLUSIVE OR/NOR LOGIC GATE CIRCUIT

[75] Inventor: Masaru Uya, Kadoma, Japan

[73] Assignee: Matsushita Electric Industrial Co., Ltd., Kadoma, Japan

[21] Appl. No.: 297,501

[22] Filed: Aug. 28, 1981

[30] Foreign Application Priority Data

Sep. 4, 1980 [JP] Japan .................................. 55-123154

[51] Int. Cl.³ ..................... H03K 19/21; H03K 19/094
[52] U.S. Cl. ...................................... 307/471; 307/451
[58] Field of Search ................ 307/448, 451, 471, 472

[56] References Cited

U.S. PATENT DOCUMENTS

| | | | |
|---|---|---|---|
| 3,500,062 | 3/1970 | Annis | 307/471 |
| 3,668,425 | 6/1972 | Schmidt, Jr. | 307/471 |
| 3,683,202 | 8/1972 | Schmidt, Jr. | 307/471 |
| 3,986,042 | 10/1976 | Padgett et al. | 307/471 X |
| 4,006,365 | 2/1977 | Marzin et al. | 307/471 |
| 4,039,858 | 8/1977 | Stewart | 307/471 X |

FOREIGN PATENT DOCUMENTS

| | | | |
|---|---|---|---|
| 52-19058 | 2/1977 | Japan | 307/471 |
| 52-19059 | 2/1977 | Japan | 307/471 |

OTHER PUBLICATIONS

Balasubramanian et al., "Three-Device Exclusive OR Circuit", IBM Tech. Discl. Bull., vol. 20, No. 10, pp. 4014-4015, 3/1978.
Ruoff, "Field Effect Transistor Logic Circuits", IBM Tech. Discl. Bull., vol. 7, No. 3, pp. 265-266, 8/1964.

Primary Examiner—Larry N. Anagnos
Attorney, Agent, or Firm—Cushman, Darby & Cushman

[57] ABSTRACT

The present invention relates to logic gate circuits of digital integrated circuits, particularly for the purpose of constituting gate circuits for realizing XNOR (Exclusive NOR) or XOR (Exclusive OR) circuits composed of CMOS (Complementary MOS), it is to offer complementary gate circuits in which the number of included transistors is reduced largely from that of conventional circuits.

3 Claims, 4 Drawing Figures

COMPLEMENTARY CHANNEL TYPE MOS TRANSISTOR EXCLUSIVE OR/NOR LOGIC GATE CIRCUIT

BACKGROUND OF THE INVENTION

1. Field of the Invention

The present invention relates to the structural method of logic gates in the digital integrated circuits composed of CMOS (complementary MOS) transistors.

2. Prior Art

In FIG. 1, a conventional CMOS exclusive NOR gate circuit (hereinafter abbreviated as XNOR) is shown. This is a well-known circuit, wherein A and B represent inputs, and Y represents an output. This circuit is composed of a NAND gate 1 having A and B as its two inputs and a composite gate 2 having $X_1$, an output of the NAND gate, and A and B as its inputs. When the output $X_1$ of the NAND gate 1 is at the low-level "L", that is, when the two inputs A and B are at the high-level "H", a P-channel MOS transistor 3 turns on and an N-channel MOS transistor 4 turns off, thereby the output Y of the composite gate becomes "H". And when the output $X_1$ is "H", that is, when the two inputs A and B are "L", the output Y becomes "H", on the other hand when one of the two inputs A and B is "H" and the other is "L", Y becomes "H". Accordingly, it is understood that the circuit of FIG. 1 operates as an XNOR in the positive logic. Hereupon, in this circuit of FIG. 1, five P-channel transistors and five N-channel transistors are used, that is, in total ten transistors are used.

Also, in FIG. 2, a conventional CMOS exclusive OR gate circuit (hereinafter, abbreviated as XOR) is shown. This is a well-known circuit, wherein A and B represent inputs, and Y represents an output. When an output of a first stage NAND gate is at the low-level "L" (ground level = $V_{SS}$), that is, when the two inputs A and B are at the high-level "H" ($V_{DD}$ level), an output of a next stage becomes "H", and when two inputs are at other combination of their input levels, the next stage acts as a NOR-gate and its output is inverted at an inverter at a final stage and becomes the output Y. Therefore, the circuit of FIG. 2 operate as a positive XOR gate. Hereupon, in this circuit, six P-channel transistors and six N-channel transistors are used, that is, in total twelve transistors are used.

As has been described above, in those conventional XNOR or XOR gate circuits, for their number of gate of two, they already include a considerably large number of transistors, making their integration scale, operation speed, and power consumption worse.

SUMMARY OF THE INVENTION

The present invention purports to offer complementary logic gate circuits in which the number of included transistors is reduced largely from that of conventional XOR or ENOR gates.

DESCRIPTION OF THE PREFERRED EMBODIMENT

The complementary logic gate circuitry comprising:
an inverter
a first and second transistors of one conductivity type,
a third and fourth transistors of the other conductivity type,
the inverter being for inverting a first input signal and issuing outputs to a source of the first transistor and to a gate of the second transistor,
the first input signal being supplied to a source of the third transistor and a gate of the fourth transistor,
a second input signal being supplied to a gate of the first transistor, a source of the second transistor, a gate of the third transistor and a source of the fourth transistor, and
all drains of the first, second, third and fourth transistors being connected in common to an output terminal.

Figure 3:
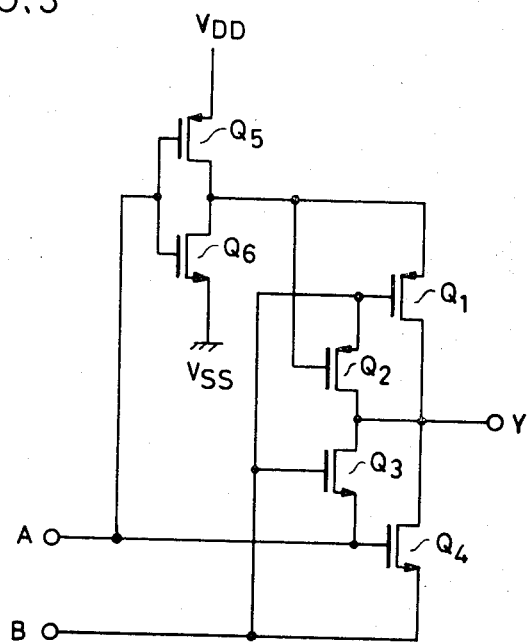
FIG. 3 and FIG. 4 are actual circuit diagrams showing embodiments of the present invention.

An XNOR gate circuit which is an embodiment of the present invention is shown in FIG. 3, wherein A and B are input terminals, Y is an output terminal, $Q_1$, $Q_2$ and $Q_5$ are P-channel enhancement type MOS transistors, and $Q_3$, $Q_4$ and $Q_6$ are N-channel enhancement type MOS transistors. Transistors $Q_5$ and $Q_6$ constitute an inverter.

The operation of this circuit is explained below. When A and B are at the low-level "L", an output of the inverter comprising $Q_5$ and $Q_6$ becomes the high-level "H", then a source and a gate of $Q_1$ become "H" and "L", respectively, thereby $Q_1$ is turned on, a source and a gate of $Q_2$ become "L" and "H", respectively, thereby $Q_2$ is turned off, a source and a gate of $Q_3$ become "L" and "L", respectively, thereby $Q_3$ is turned off, and a source and a gate of $Q_4$ becomes "L" and "L", respectively, thereby $Q_4$ is turned off. Therefore, the output terminal Y becomes "H". In a similar manner, for the other combinations of the level to the input terminals A and B, the output level at Y is found to become such as shown in Table 1.

TABLE 1

| Input | | $Q_1$ Source poten- tial | $Q_1$ Gate poten- tial | $Q_2$ | | $Q_3$ | | $Q_4$ | | States of transistors | | | | Output |
| --- | --- | --- | --- | --- | --- | --- | --- | --- | --- | --- | --- | --- | --- | --- |
| A | B | | | Source | Gate | Source | Gate | Source | Gate | $Q_1$ | $Q_2$ | $Q_3$ | $Q_4$ | Y |
| L | L | H | L | L | H | L | L | L | L | ON | OFF | OFF | OFF | H |
| L | H | H | H | H | H | L | H | H | L | OFF | OFF | ON | OFF | L |
| H | L | L | L | L | L | H | L | L | H | OFF | OFF | OFF | ON | L |
| H | H | L | H | H | L | H | H | H | H | OFF | ON | OFF | OFF | H |

Figure 1:
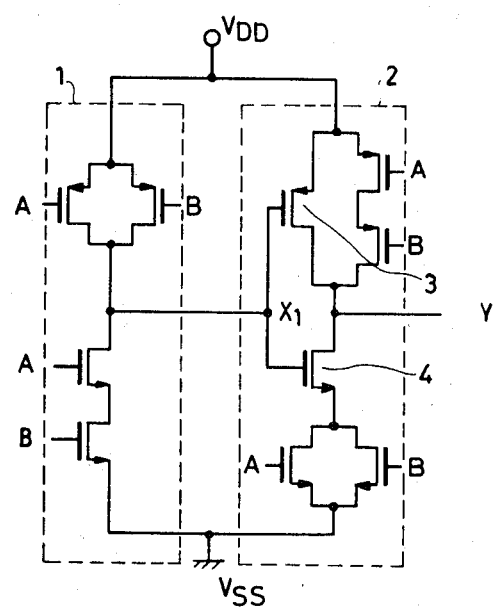
FIG. 1 and FIG. 2 are circuit diagrams showing examples of conventional CMOS gate circuits.
Figure 2:
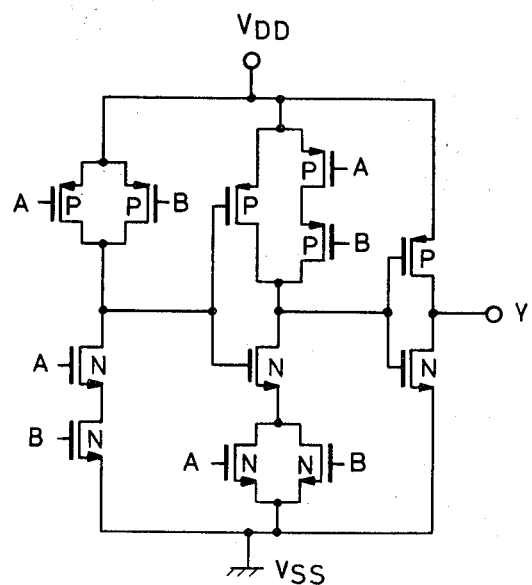

Therefore, the circuit of FIG. 3 operates as an XNOR gate circuit. In addition to the above, as shown in Table 1, since the transistor being at the on-state is only either one among those transistors $Q_1$ to $Q_4$, no steady-state current flows. The number of contained transistors is only six including the inverter, which is a sharp decrease from that in the conventional gate circuit of FIG. 1.

The present invention is also to offer an XOR gate circuit in which the number of included transistors is reduced largely from that of the conventional XOR gate circuit.

Figure 4:
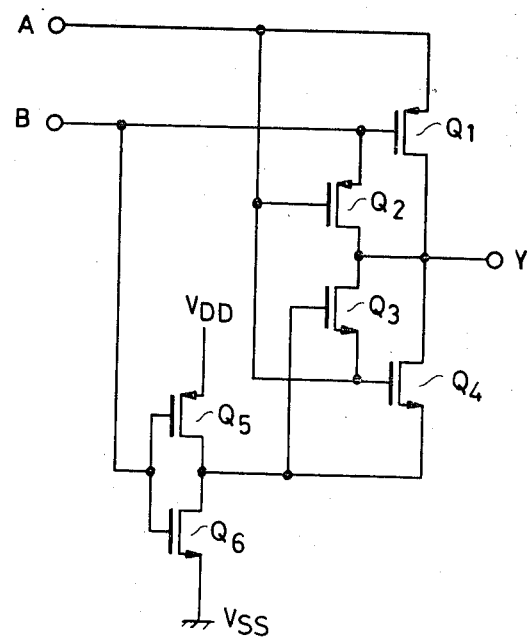

An XOR gate circuit which is an embodiment of the present invention is shown in FIG. 4, wherein A and B are input terminals, Y is an output terminal, $Q_1$, $Q_2$ and $Q_5$ are P-channel enhancement type MOS transistors, and $Q_3$, $Q_4$ and $Q_6$ are N-channel enhancement type MOS transistors. Transistors $Q_5$ and $Q_6$ constitute an inverter.

The operation of this circuit is explained below. When A and B are at the low-level "L", an output of the inverter composed of $Q_5$ and $Q_6$ becomes the high-level "H", then a source and a gate of $Q_1$ becomes "L" and "L", respectively, thereby $Q_1$ is turned off, a source and a gate of $Q_2$ become "L" and "L", respectively, thereby $Q_2$ is turned off, a source and a gate of $Q_3$ becomes "L" and "H", respectively, thereby $Q_3$ is turned on, and a source and a gate of $Q_4$ become "H" and "L", respectively, thereby $Q_4$ is turned off. Therefore, the output terminal Y become "H". In a similar manner, for other combinations of the level to the input terminals A and B, the output level at Y is found to become such as shown in Table 2.

TABLE 2

| Input | | $Q_1$ | | $Q_2$ | | $Q_3$ | | $Q_4$ | | States of transistors | | | | Output |
| --- | --- | --- | --- | --- | --- | --- | --- | --- | --- | --- | --- | --- | --- | --- |
| A | B | Source potential | Gate potential | Source | Gate | Source | Gate | Source | Gate | $Q_1$ | $Q_2$ | $Q_3$ | $Q_4$ | Y |
| L | L | L | L | L | L | L | H | H | L | OFF | OFF | ON | OFF | L |
| L | H | L | H | H | L | L | L | L | L | OFF | ON | OFF | OFF | H |
| H | L | H | L | L | H | H | H | H | H | ON | OFF | OFF | OFF | H |
| H | H | H | H | H | H | H | L | L | H | OFF | OFF | OFF | ON | L |

Therefore, the circuit of FIG. 4 operates as an XOR gate circuit. In addition to the above, as shown in Table 2, since the transistor being at the on-state is only either one among those transistors $Q_1$ to $Q_4$, no steady-state current flows. The number of contained transistors is only six including the inverter, which is a sharp decrease from that in the conventional gate circuit of FIG. 3.

As has been explained above, in accordance with the present invention, the XNOR gate circuit or the XOR gate circuit having small number of transistors can be obtained, then when they are used in the large scale integrated circuits, their value is of very high. Also the present device is advantageous in smallness of power consumption since only on transistor of $Q_1$ to $Q_4$ is in on-state as shown by the tables.

What is claimed is:

1. A complementary transistor type logic gate circuit comprising:
    a first input terminal to which a first input signal is applied,
    a second input terminal to which a second input signal is applied,
    an output terminal,
    an inverter
    a first transistor and a second transistor of one conductivity type having gate, source and drain electrodes,
    a third transistor and a fourth transistor of a complementary conductivity type having gate, source and drain electrodes,
    said inverter being operatively connected to invert said first input signal and issue outputs to a source of said transistor and to a gate of said second transistor,
    said first input terminal being operatively connected to a source of said third transistor and a gate of said fourth transistor,
    said second input terminal being operatively connected to a gate of said first transistor, a source of said second transistor, a gate of said third transistor and a source of said fourth transistor, and
    all drains of said first, second, third and fourth transistors being connected in common to said output terminal.

2. A complementary logic gate circuit in accordance with claim 1, wherein
    said first transistor and said second transistor are P-channel enhancement type MOS transistors, and
    said third transistor and said fourth transistor are N-channel enhancement type MOS transistors.

3. A complementary logic gate circuit in accordance with claim 1, wherein
    said first transistor and said second transistor are N-channel enhancement type MOS transistors, and
    said third transistor and said fourth transistor are P-channel enhancement type MOS transistors.

* * * * *